United States Patent [19]

Bose et al.

[11] Patent Number: 4,847,551
[45] Date of Patent: Jul. 11, 1989

[54] APPARATUS FOR MEASURING CAPACITANCE OF A LOW VALUE THREE-TERMINAL CAPACITOR WITH A RESONANCE TECHNIQUE

[75] Inventors: Tapan K. Bose, Trois-Riviéres; Raymond Courteau, St-Maurice, both of Canada

[73] Assignee: Universite Du Quebec A Trois-Rivieres, Quebec, Canada

[21] Appl. No.: 194,862

[22] Filed: May 17, 1988

[51] Int. Cl.$^4$ .................... G01R 11/52; G01R 27/26
[52] U.S. Cl. ................................ 324/60 C; 324/60 R; 324/57 Q
[58] Field of Search .............. 324/57 Q, 61 QS, 60 C, 324/60 R

[56] References Cited

U.S. PATENT DOCUMENTS 1,905,349  4/1933  Edwards et al. ................. 324/60 C
3,896,374  7/1975  Delafon ........................... 324/60 C

FOREIGN PATENT DOCUMENTS 561151  8/1987  U.S.S.R. .......................... 324/60 C

OTHER PUBLICATIONS

M. D. Benadda, J. C. Carru, and C. Druon, J. Phys. E 15, 132 (1982).
I. Ogawa and A. Kakimoto, Rev. Sci. Instrum. 49, 936 (1978).
B. Ichijo and T. Arai, Rev. Sci. Instrum. 32, 122 (1961).
L. D. White and R. C. Strum, Bell Syst. Tech. J. 60, 405 (1981).
R. Chahine and T. K. Bose, Rev. Sci. Instrum. 54, 1243 (1983).
R. H. Cole, IEEE Trans. Instrum. Meas. IM-32, 42 (1983).
B. Gestblom, J. Phys. E 15, 87 (1982).
J. F. Hersh, General Radio Experimenter, vol. 3, 1 (1959).
R. Courteau and T. K. Bose, Rev. Sci. Instrum. 58, 1096 (1987).
J. G. Berberian and R. H. Cole, Rev. Sci. Instrum. 40, 811 (1969).

Primary Examiner—Reinhard J. Eisenzopf
Assistant Examiner—Anthony L. Miele
Attorney, Agent, or Firm—Foley & Lardner, Schwartz, Jeffery, Schwaab, Mack, Blumenthal & Evans

[57] ABSTRACT

The unknown capacitor or a standard capacitor are switched, one at a time, in parallel to a frequency setting circuit which sets the frequency of operation. The parallel combination of the unknown capacitor and the frequency setting circuit form a first parallel resonant circuit and the parallel combination of the standard capacitor and the frequency setting circuit form a second resonant parallel circuit. These resonant circuits are part of the feedback network of an oscillator. The bottom ends of the resonant circuits are connected to an instrumentation amplifier for maintaining the bottom ends at virtual ground in order to make three terminal measurements. A frequency meter is provided for measuring the frequency of resonance of the first resonant circuit and the second resonant circuit.

8 Claims, 5 Drawing Sheets

APPARATUS FOR MEASURING CAPACITANCE OF A LOW VALUE THREE-TERMINAL CAPACITOR WITH A RESONANCE TECHNIQUE

BACKGROUND OF INVENTION

1. Field of the Invention

The invention relates to an apparatus for measuring the capacitance value of a low value three terminal capacitor. More specifically, the invention relates to such an apparatus which contains a means for maintaining a point in the circuitry of the apparatus at virtual ground.

The means for maintaining the point at virtual ground is preferably an active guard circuit. The invention also relates to an instrumentation amplifier which may be used as the guard circuit. The instrumentation amplifier may be used for other purposes as well.

2. Description of Prior Art

The apparatus of the present invention comprises a resonant system using an active guard circuit and using a substitution method to compare the capacitance value of unknown three-terminal capacitors (3TC) with the capacitance value of a variable standard 3TC that could be operated in the frequency range 50 kHz–10 MHz for making dielectric measurements.

Dielectric measurements in this frequency range are commonly made with home built resonance circuits (M. D. Benadda, J. C. Carru, and C. Druon, J. Phys. E 15, 132 (1982); I. Ogawa and A. Kakimoto, Rev. Sci. Instrum. 49, 936 (1978); and B. Ichijo and T. Arai, Rev. Sci. Instrum. 32, 122 (1961)). This is because resonant methods generally lead to measuring systems which are simple, accurate, easy to calibrate, and which use instruments already found in most laboratories such as frequency meters, oscilloscopes, and signal generators. In contrast, bridge method systems which would permit precise measurements of low value capacitors in the radio frequency range are rather elaborate (L. D. White and R. C. Strum, Bell Syst. Tech. J. 60, 405 (1981)), since they either involve many conductance and capacitance standards with low parasitics or a few standards and precise phase-sensitive detection which is difficult to achieve in the MHz range. Because they are designed for a 50 ohm reference, commercially available impedance analyzers are not very practical for small capacitance measurements in the MHz range. Transmission line sampling, with digital data processing has been used and can be improved for measurements from 1 to 200 MHz or even 10 GHz, with reasonable precision on both capacitance and dissipation factor, as can time domain reflectometry (R. Chahine and T. K. Bose, Rev. Sci. Instrum. 54, 1243 (1983); R. H. Cole, IEEE Trans. Instrum. Meas. IM-32, 42 (1983) and B. Gestblom, J. Phys. E 15, 87 (1982)). However, transmission line methods permit measurement of two terminal devices only, and they can never match the precision of a three terminal measurement (J. F. Hersh, General Radio Experimenter, Vol. 3, 1 (1959)).

Turning to three-terminal measurements (3TM), as there is no point in the circuit being naturally at virtual ground, resonance methods do not lend themselves to 3TM. Since 3TM's are superior to ordinary two terminal measurements for dielectric measurements up to 10 MHz (R. Courteau and T. K. Bose, Rev. Sci. Instrum. 58, 1096 (1987)), the development of an active guard circuit to maintain a point in the circuit at virtual ground would facilitate the use of the three-terminal configuration over its upper useful frequency range. The benefits of such a system for dielectric measurements are that: (1) it enables the use of 3TC's and three-terminal cells, simplifying calibration procedures and permitting higher accuracy; and (2) it permits the use of flexible coaxial cables of arbitrary length for making the connections (although the length is limited at high frequencies), since the parallel capacitance of the cables becomes part of the terminal impedances, which do not influence the result for an ideal 3TM. While bridges may be designed so that no additional circuits are required to do 3TM's (J. G. Berberian and R. H. Cole, Rev. Sci. Instrum. 40, 811 (1969)), other methods generally need a guard circuit to ensure that terminal impedances are not part of the measurement.

Precise dielectric measurements within the frequency range 50 kHz–10 MHz are important for the study of dielectric relaxation of polymers and biological systems, ionic relaxation in microemulsions, and Maxwell-Wagner absorption in emulsions.

SUMMARY OF INVENTION

It is therefore an object of the invention to provide an apparatus for measuring capacitance of an unknown low value three-terminal capacitor by a substitution method.

It is a further object of the invention to provide such an apparatus which includes a means for virtual ground.

It is a still further object of the invention to provide such a means which constitutes an active guard circuit.

It is a still further object of the invention to provide an instrumentation amplifier which may be configured to act as such an active guard circuit, and which may also be configured to provide a virtual ground in other electronic circuits.

In accordance with the invention there is provided an apparatus for measuring capacitance of an unknown low value three-terminal capacitor (3TC) by a substitution method. The apparatus includes a frequency setting means and a variable capacitance standard 3TC. Switch means connect either one end of the unknown capacitor or one end of the standard capacitor to one end of the frequency setting means. The other ends of the unknown capacitor, the standard capacitor and the frequency setting means are connected to a common point. Thus, a first parallel resonance circuit is formed with the unknown capacitor and the frequency setting means when the switch means connects the one end of the unknown capacitor to the one end of the frequency setting means, and a second parallel resonant circuit is formed with the standard capacitor and the frequency setting means when the switch means connects the one end of the standard capacitor to the one end of the frequency setting means. Means are provided for maintaining the common point at virtual ground, and frequency measuring means are provided for measuring the frequency of resonance of the first resonant circuit and the second resonant circuit.

BRIEF DESCRIPTION OF DRAWINGS

The invention will be better understood by an examination of the following description, together with the accompanying drawings, in which.

DESCRIPTION OF PREFERRED EMBODIMENTS

Figure 1:
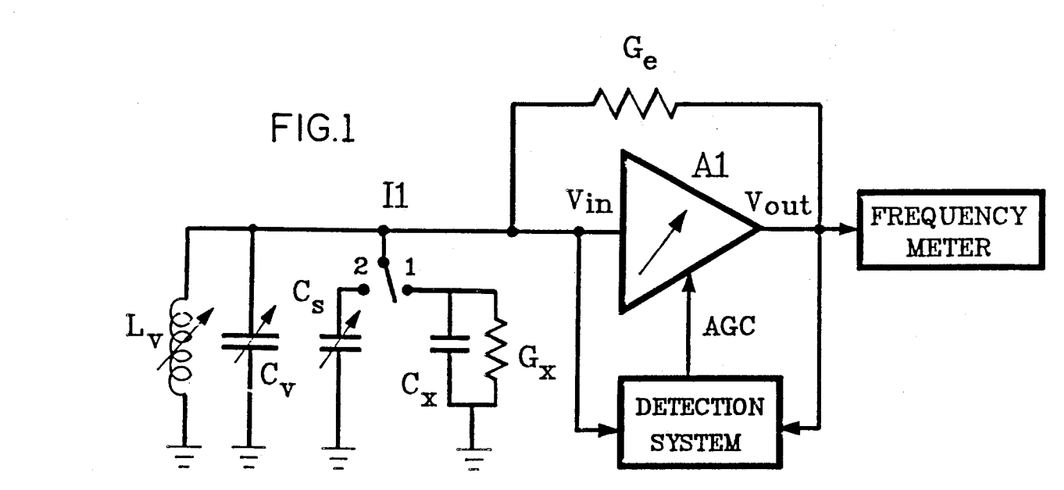
FIG. 1 is a schematic diagram for illustrating the principle of the substitution method for measuring capacitance.

Referring to FIG. 1, a system for determining the capacitance value of an unknown capacitor $C_x$ consists of a frequency setting means which includes variable inductor $L_v$ and variable capacitor $C_v$. It also includes a standard variable capacitor $C_s$ as well as amplifier A1. The purpose of amplifier A1 is to maintain oscillations and for this purpose, it includes an automatic gain control system including the detection system D. The gain of amplifier A1 is maintained just sufficient to sustain oscillations at an adequate level. Feedback conductance $G_e$ is assumed to have a zero phase angle and amplifier A1 is assumed to have a zero phase shift. Under these conditions the sustained frequency will just be the resonant frequency of the LC tank since this is the only frequency where the loop phase shift is null.

Frequency meter F detects the oscillation frequency. Switch I1 puts either $C_s$ or $C_x$ into the circuit.

In operation, switch I1 is set so that $C_x$ is in the circuit and $L_v$ is adjusted until approximately the area of frequency in which it is desired to take measurements. $C_v$ is then adjusted so that the exact frequency of measurement is attained. This frequency will be designated $f_1$.

Switch I1 is then switched so that $C_s$ is in the circuit, whereupon the frequency meter F reads a new frequency $f_2$. $C_s$ is adjusted until such time as $f_2 = f_1$. At this point, $C_s = C_x$. As the value of $C_s$ is known, the value of $C_x$ is also known. When $f_2 = f_1$, the following relationship is also true:

$$G_x = G_e(V_{Ge1}/V_{in1} - V_{Ge2}/V_{in2}) \quad (1)$$

where $V_{Ge}$ = Voltage across $G_e$
$V_{in}$ = Voltage at input of amplifier A1.

The advantages of the substitution method over other techniques are:

1. The only precision components needed for the measurement of a lossy capacitor are a variable standard capacitor and a precision resistor. $L_v$ and $C_v$ are part of the circuit only for the establishment of a resonant frequency, and it is only necessary to know that their values will remain unchanged during the measuring period. This is, of course, particularly useful for $L_v$ since it is very difficult to design inductors having characteristics as good as capacitors. In addition, precision 3TC's well suited to act as standard capacitors are readily available, and ordinary metal film resistors are adequate for $G_e$.

2. A self-oscillating method makes use of the fact that the circuit oscillates naturally at the measurement steps and shorter measurement time than with other resonance techniques where it is necessary to manually detect the resonant frequency by varying the frequency of a generator or the value of an inductor or a capacitor while monitoring the output of a detector.

3. A self-oscillating method also eliminates the need for a signal source.

4. The resolution of the capacitance comparison depends only on the resolution of the frequency meter which can be very high.

Figure 2A:
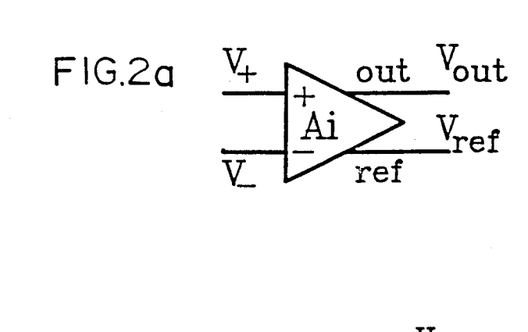
FIG. 2(a) is a diagram illustrating the basic principle of the instrumentation amplifier.
Figure 2B:
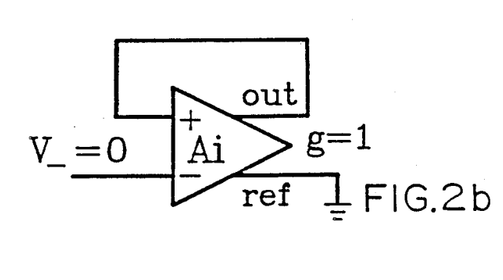
FIG. 2(b) illustrates an instrumentation amplifier configured as a guard circuit.
Figure 2C:
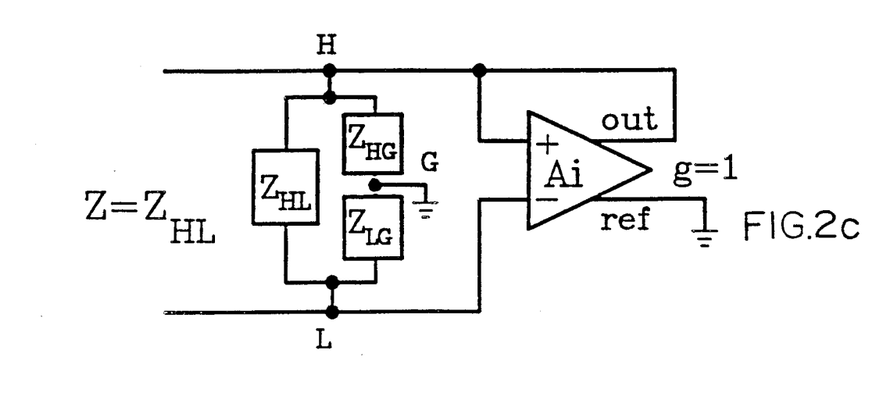
FIG. 2(c) illustrates a configuration for high frequency three-terminal measurement using the instrumentation amplifier in accordance with the invention.

As above-mentioned, in order to apply 3TM's to resonant methods, it is necessary to provide a means for maintaining a point of the circuit at virtual ground. For this purpose, we have developed an instrumentation amplifier as illustrated in FIG. 2. The instrumentation amplifier is defined as a voltage amplifier with differential inputs and outputs satisfying the following relationship:

$$V_{out} - V_{ref} = g(V_+ - V_-) \quad (2)$$

where g is the differential gain of the amplifier.

To use the instrumentation amplifier of FIG. 2a to maintain a point at virtual ground, the amplifier is configured as illustrated in FIG. 2b. With the instrumentation amplifier configured as in FIG. 2b, and with:

$$V_{ref} = 0, \ g = 1, \ V_{out} = V_+$$

equation (1) above reduces to the following:

$$V_{out} - 0 = 1 \ (V_{out} - V_-)$$

$V_- = 0$ (if the amplifier is not saturated).

Thus, the minus terminal of the amplifier in FIG. 2b is at virtual ground.

A block diagram for high frequency three terminal measurements, using the instrumentation amplifier configured as in FIG. 2b to maintain a point L at virtual ground is illustrated in FIG. 2c. In FIG. 2c, $V_{LG} = 0$, and the impedance seen between H and L is directly $Z_{HL}$, if we do a floating measurement with respect to ground.

Figure 3:
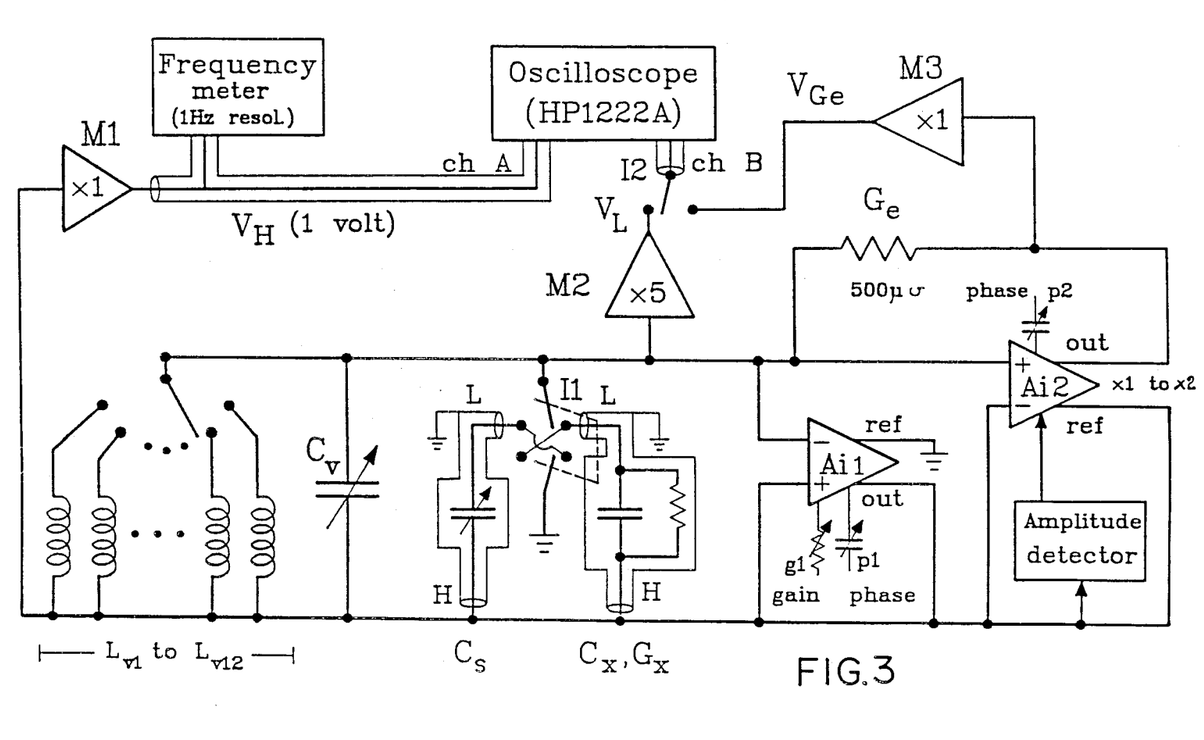
FIG. 3 is a schematic diagram of one embodiment of the invention.

A complete circuit, embodying the principles of FIG. 2c, is illustrated in FIG. 3. Once again, $L_v$ is a variable inductor and $C_v$ is a variable capacitor. $C_s$ is the standard capacitor while $C_x$ is the unknown capacitor. The purpose of amplifier Ai1 is to maintain point L at virtual ground, and the purpose of Ai2 is to amplify the voltage across the LC tank and apply it differentially across the entire RLC network with a controlled gain so as to sustain oscillations (as A1 in FIG. 1). As the lower end of $C_x$ is no longer connected at ground as it was in FIG. 1, we now need an instrumentation amplifier Ai2 to form the oscillator:

The switch I1 is located at the L terminal and is a double-pole double-throw type wired in such a way that the 3TC not connected to the resonant circuit has its L terminal shorted to ground. This makes the residual capacitances across the switch part of the terminal capacitances instead of the LC tank. At the same time, Ai1 has a load which is independent of the position of the switch when $C_s = C_x$ even if the terminal capacitances of the 3TC's are not equal. This has an added benefit since, because of the finite output impedance of Ai1, even a load difference as small as 10 pF would have necessitated readjustment of the gain Ai1 when toggling the switch therefore increasing the measurement time.

The twelve inductors which form $L_v$ have values ranging from 3.5 μH to 50 mH and have geometric ratios of about 2.4. They are selected one at a time with a rotary switch. $C_v$ has a range of values from 30–100 pF. Accordingly, the arrangement permits covering, without gap, the entire frequency range 50 kHz–10 MHz.

The system of FIG. 3 once again includes the frequency meter F as well as an oscilloscope O. In addition, the circuit includes amplifiers or buffers M1, M2 and M3. The input of M1 is fed from the common point to which are connected one end of $L_v$, $C_v$ and the connected one of $C_s$ or $C_x$. The output of M1 is connected to the frequency meter and to channel A of the oscilloscope.

Channel B of the oscilloscope is connected to switch I2 which can be switched between the output of M2 and M3.

Ai1 has two adjustments, g1 and p1, to trim, respectively, the real part of its gain to 1 and its imaginary part to 0. These adjustments are made by monitoring VL (with switch I2 connected to the output of M2) after obtaining the required values of $L_v$, $C_v$ for the desired frequency. Similarly, Ai2 has an adjustable phase compensation p2 in order to null its phase shift at the measuring frequency. This adjustment is made by monitoring the phase of $V_{Ge}$ with respect to VH on the oscilloscope.

Voltages $V_H$, $V_L$ and $V_{Ge}$ are fed, after being amplified or buffered by M1, M2 and M3 respectively, to the two-channel oscilloscope and the frequency meter. The oscilloscope is used for conductance measurements and adjustments of g1, p1 and p2, and the frequency meter is used to compare $f_1$ to $f_2$.

In a preferred embodiment, the elements Ai1, Ai2, the detection system, M1 and M3 are mounted on a printed circuit board, while $L_v$, $C_v$ and M2 are mounted on another board separated from the previous one by a grounded copper sheet. This arrangement is used because it has been found that fields emitted by the inductors are sufficiently coupled to cause errors in the measurement. The amplitude of the voltage across the LC tank is fixed at one volt by the detection system and Ai2 so that all amplifiers operate inside their dynamic range while the low level signals monitored ($V_{Ge}$ and $V_L$) are sufficiently strong relative to the noise present.

The characteristics of the various elements making up the circuit are as below:

1 Ai2

Figure 5:
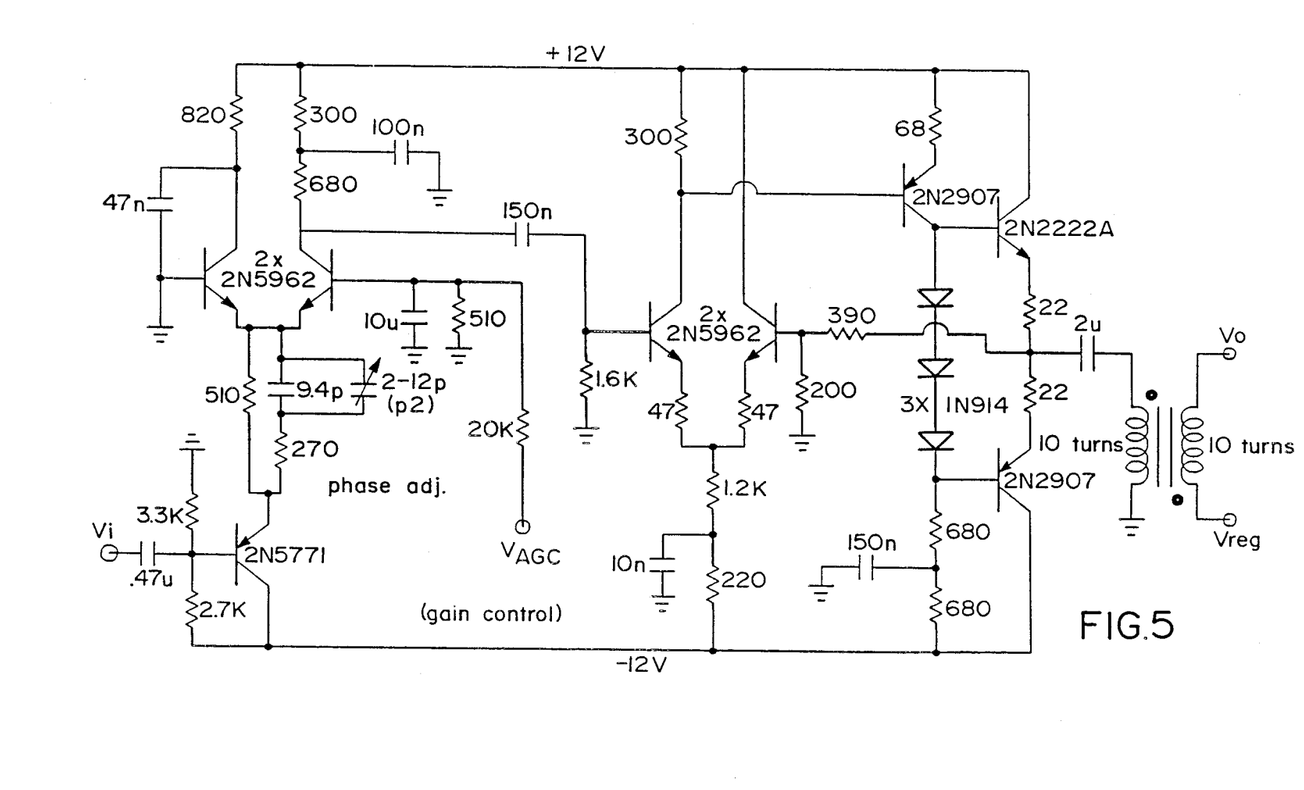
FIG. 5 is a circuit diagram of one embodiment of the instrumentation amplifier Ai2.

As in the case of Ai1, this is also an instrumentation amplifier. The requirements of low differential output impedance, possibility of adjusting the phase at 0° over 50 kHz 10 MHz range, gain variable from at least +1 to +2 to compensate for the losses in the LC tank phase independent of gain variations and high linearity with a 1 volt amplitude, are provided with this amplifier, which is a conventional video voltage controlled gain amplifier with transformer coupled output. The complete circuit diagram is illustrated in FIG. 5.

2. Inductors and the variable capacitor

The requirements for these elements are sufficient stability to enable accurate capacitance comparison (approximately 100 ppm/°C.) and sufficient high quality factor Q to have a reasonable sensitivity on the measurement of G, the equivalent parallel conductance of the unknown. It has been determined that in order to have a sensitivity of 0.001 on the dissipation factor of the unknown, it is necessary that Q>60. Regular tuning variable capacitors are good enough to meet this requirement and the one for stability and have been used for $C_v$. The inductors have been provided by four multitap windings wound on toroidal cores made of iron powder for the three cores used for the highest frequencies (200 kHz–10 MHz). Ferrite has been used for the low frequency one (50–200 kHz) because this material has higher permeability and permits making the required inductances in a reasonable volume. Unfortunately, the quality factor of the ferrite loaded inductors (approximately 9) is not very satisfactory compared to the ones made with iron powder core (60–200). In addition, the stability of the low frequency inductors is worse than the high frequency ones.

3. Conductance $G_e$

The requirements for this element are that its value be constant over the whole frequency range in order to use the results of dc measurements as the value of $G_e$ when calculating $G_x$ and, also, that its phase angle be sufficiently small so that it does not introduce errors when comparing a lossy capacitor with a lossless one. In one embodiment, $G_e$ is a 2 k-ohm metal film resistor. This type of resistor has a good temperature stability (50 ppm/°C.) and low parasitics (about 0.2 pF parallel capacitance). (J. G. Berberian, Rev. Sci. Instrum. 48, 1207 (1977)). Also the value of 2 k-ohms simultaneously minimizes the effect of the parallel capacitance and of the series output inductance of Ai2 0.55 μH), while simultaneously giving a reasonable sensitivity on the measurement of $G_x$ (500 μohms/volts). If the output inductance of Ai2 is combined with $G_e$, its phase angle $\phi$ is such that tan ($\phi$) is less than 0.002 (frequency in MHz) and is sufficiently low that the errors mentioned above are almost always much lower than uncertainties of measurements.

Concerning the instrumentation amplifier, it is impossible to have its gain g be exactly 1, and, as such, the impedance between H and L in FIG. 2c is slightly dependent on terminal impedances. In the case of a 3TC with $Z_{LG}=1$ ($j\omega C_{LG}$), it may be shown that the measured impedance would be $Z_{HL}$ in parallel with the residual capacitance $C_p$ and residual conductance $G_p$ given by:

$$C_p = C_{LG} Re(1-g) \quad (3)$$

$$G_p = -C_{LG} Im(1-g) \quad (4)$$

We want $C_p$ and $G_p$ to be negligibly small in order to measure $Z_{HL}$ independently of $C_{LG}$. To illustrate what this implies for the value of g, consider a realistic case of a three-terminal dielectric measurement where $C_{LG}$ is 100 pF, and we want the residual 0.001 pF or less. From equation (4), we can see that we should fulfill the condition g=1/0°±10 ppm. This requirement may be satisfied in the megahertz range provided it is possible to adjust the gain g at the measurement frequency. Fortunately, the condition g=1/0° is easily detected because, when it is attained, the L terminal will be at virtual ground. We need only to excite the impedance at the desired frequency, monitor $V_L$, and adjust g so that $V_L$ vanishes.

However, in order for this method to be usable in the megahertz range, specific requirements must be met by the instrumentation amplifier Ai1. In particular, we want to have a high differential input impedance because it will be in parallel with the unknown and the possibility of adjusting the differential gain at 1/0° over the operating frequency range. Other requirements are good common mode rejection, so that there is no need to readjust the gain when the amplitude of the oscillations varies, good power supply rejection for the same reason, and low output impedance in order to drive large capacitive loads at high frequencies.

Figure 4:
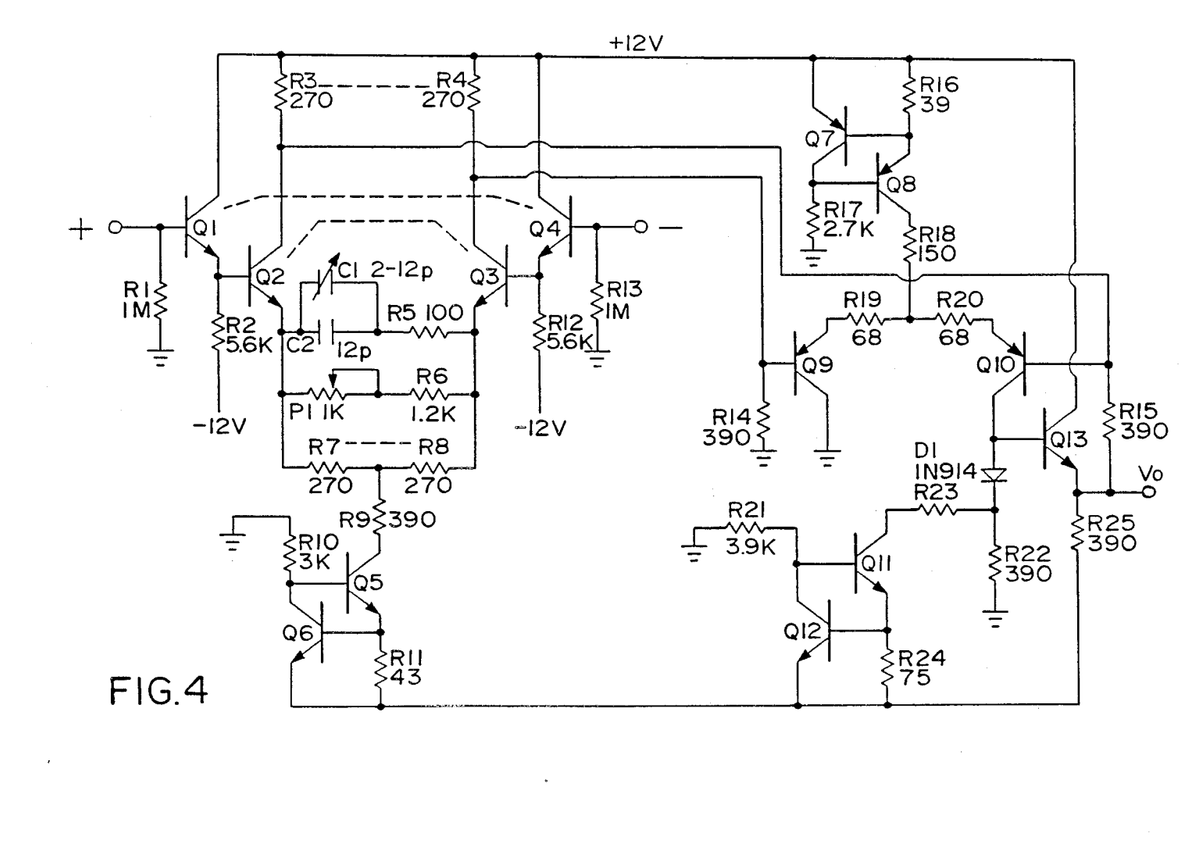
FIG. 4 is a circuit diagram of one embodiment of the instrumentation amplifier Ai1.

FIG. 4 illustrates a circuit diagram for the instrumentation amplifier Ai1 which is optimized for a three-terminal impedance measurement at frequencies up to 10 MHz. It uses two differential pair amplifiers (Q1-Q2-Q3-Q4 and Q9-Q10) with emitter degeneration (R6-R7-R8-P1 and R19-R20), polarized with current sources (R9-R10-R11-Q5-Q6, R16-R17-R18-Q7-Q8, R21-R23-R24-Q11-Q12) so as to obtain a good common mode rejection ratio and a low supply sensitivity. Q13 rejection ratio and a low supply sensitivity. Q13 serves as a buffer in order to have a low output impedance. Feedback is taken from the output ($V_o$) to the input of the second stage (R15) in order to extend the bandwidth and lower again the output impedance.

Figure 6:
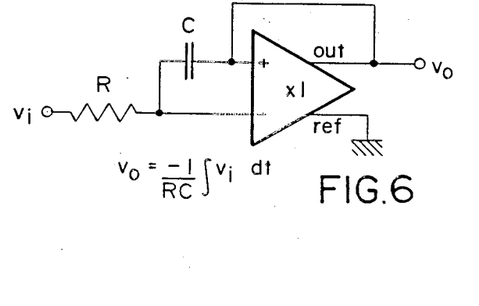
FIG. 6 illustrates the instrumentation amplifier configured as a high speed integrator.

In FIG. 6, all resistors are in ohms and capacitors are in Farads. Components bounded by dashlines are matched together. The following transistor types were employed in one embodiment:

Q1, Q2, Q3, Q4: 2N5962
Q5, Q6, Q11, Q12: 2N2501
Q7, Q8, Q9, Q10: 2N5771
Q13: 2N2222A.

Table I below summarizes the principal characteristics of this amplifier. The gain is nearly 1/0° from dc to 10 MHz. The real and imaginary parts can be trimmed so that the real part is 1 and the imaginary part is 0 at any frequency between dc and 10 MHz by adjustments of P1 and C1.

TABLE I

| Characteristics of instrumentation amplifier Ai1 | |
|---|---|
| Parameter | Value |
| Usable frequency range (over which gain may be adjusted at 1/0°) | dc-10 MHz |
| 3-dB bandwidth | ~50 MHz |
| Common-mode dynamic range | ±5 V |
| Differential-mode dynamic range | ±3 V |
| Common-mode rejection ratio | dc-500 kHz 80 dB 500 kHz-1 MHz 70 dB 1-10 MHz 60 dB |
| Differential input impedance (calculated) | 150 MΩ\|\|0.015 pF\|\| $\frac{-3.24 M\Omega}{(f/10^6)^2}$ |
| Common-mode input impedance (calculated) | 3 MΩ\|\|2.2 pF |
| Output impedance | dc-1 MHz 5 Ω 1-10 MHz 8 Ω |

Figure 7:
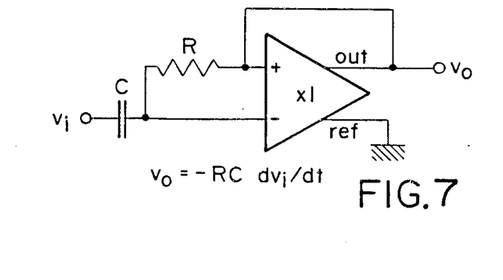
FIG. 7 illustrates the instrumentation amplifier configured as a high speed differentiator.

In FIG. 6, the instrumentation amplifier is shown configured as a high speed integrator while in FIG. 7 it is shown configured as a high speed differentiator.

In FIG. 6:

$$v_o = \frac{-1}{RC} \int v_i dt$$

In FIG. 7:

$o = -RC \, dv_i/dt.$

Although the instrumentation amplifier is preferably used in the system, an operational amplifier could also be used to make three-terminal measurements with an arbitrary measurement method. It is well known that an operational amplifier maintains its inverting input at virtual ground when the noninverting one is connected to ground. Thus, by connecting the G terminal of a 3TC to ground, H to the output and L to the inverting input, the impedance between H and L will again be directly $Z_{HL}$ if we make a floating measurement. Thus, an operational amplifier could be used.

However, a disadvantage of so using an operational amplifier is that an operational amplifier has a large but finite gain. This leads to residual parallel capacitance and parallel conductance across $Z_{HL}$. It can be shown that the requirement $g=1/0°±10$ ppm for the instrumentation amplifier would now translate to $G|>10^5$ or 100 dB voltage gain.

It would be extremely difficult to have a gain this high in the megahertz region while avoiding parasitic oscillations since the network $Z_{HL}-Z_{LG}$ constitutes a feedback loop for the amplifier. Accordingly, phase shifts must be taken into account in the loop for all frequencies where the loop gain is greater than unity. To be usable in the megahertz range, the amplifier should have a gain bandwidth product of at least 500–1000 MHz and to have tuned circuits to have sufficient gain at the measurement frequency. Consequently, this approach is best suited for low audio frequencies (say below 10 kHz).

Although particular embodiments have been described, this was for the purpose of illustrating, but not limiting, the invention. Various modifications, which will come readily to the mind of one skilled in the art, are within the scope of the invention as defined in the appended claims.

We claim:

1. Apparatus for measuring the capacitance of an unknown low value three-terminal capacitor (3TC) by a substitution method, comprising:
   frequency setting means;
   a variable capacitance standard 3TC;
   switch means for connecting either one end of said unknown capacitor or one end of said standard capacitor to one end of said frequency setting means, the other ends of said unknown capacitor, said standard capacitor and said frequency setting means being connected to a common point, whereby, a first parallel resonant circuit is formed with said unknown capacitor and said frequency setting means when said switch means connects said one end of said unknown capacitor to said one end of said frequency setting means, and a second parallel resonant circuit is formed with said standard capacitor and said frequency setting means when said switch means connects said one end of said standard capacitor to said one end of said frequency setting means;
   means for maintaining one end of said resonant circuit at virtual ground; and
   frequency measuring means for measuring the frequency of resonance of said first resonant circuit and said second resonant circuit.

2. An apparatus as defined in claim 1 wherein said frequency setting means comprises variable conductor means in parallel with variable capacitor means.

3. An apparatus as defined in claim 1 wherein said means for maintaining virtual ground comprises a differential input and differential output amplifier having a gain g, a $V_+$ input terminal, a $V_-$ input terminal, a $V_{out}$ output terminal, and a $V_{ref}$ input terminal, wherein the following relation is satisfied:

$$V_{out} - V_{ref} = g(V_+ - V_-)$$

4. An apparatus as defined in claim 1 wherein said switch comprises an output terminal and a switching terminal;

said output terminal of said switch being connected to said one end of said frequency setting means;

said switching terminal being switchable to either said one end said unknown capacitor or said one end of said standard capacitor.

5. An apparatus as defined in claim 1 wherein said common point is connected to the input of said frequency measuring means.

6. An apparatus as defined in claim 5 and including a first buffer amplifier between said common point and said input of said frequency measuring means.

7. An apparatus as defined in claim 4 and including an oscillation sustaining amplifier having a gain g, a $V_+$ input terminal, a $V_-$ input terminal, a $V_{out}$ output terminal, and a $V_{ref}$ output terminal;

said output terminal of said switch being connected to said $V_+$ input terminal;

and means for adjusting said gain g.

8. An apparatus as defined in claim 7 and further including oscilloscope means having a channel A input and a channel B input;

said common point being connected to said channel A input;

a second switch means being connected to said channel B input;

a second buffer amplifier having an input terminal connected to the output terminal of said switching means and an output terminal;

a third buffer amplifier having an input terminal connected to said $V_{out}$ output terminal and an output terminal;

said second switching means being adapted to be switched between said output terminal of said second buffer amplifier and said output terminal of said third buffer amplifier.

* * * * *

UNITED STATES PATENT AND TRADEMARK OFFICE
CERTIFICATE OF CORRECTION

PATENT NO. : 4,847,551

DATED : July 11, 1989

INVENTOR(S) : Tapan K. Bose and Raymond Courteau

It is certified that error appears in the above-identified patent and that said Letters Patent is hereby corrected as shown below:

Column 2, line 29, after "for" should read --maintaining a point in the circuitry of the apparatus at--.

Column 4, line 2, before "measurement" should read --resonant frequency of the LC tank. This results in less--.

Column 5, line 56, after "tank" should read --,--.

Column 6, line 32, "μohms" should read --μmhos--.

Column 6, line 42, after "1" should read --/--.

Column 7, lines 16-17, "Q13 rejection ratio and a low supply sensitivity." should be deleted.

Column 7, line 60, the equation should read $$v_o = \frac{-1}{RC} \int v_i \, dt$$

Column 7, line 64, "o=" should read $--v_o = --$.

Column 8, line 6, "ZHL" should read $--Z_{HL}--$.

UNITED STATES PATENT AND TRADEMARK OFFICE
CERTIFICATE OF CORRECTION

PATENT NO. : 4,847,551

DATED : July 11, 1989

INVENTOR(S) : Tapan K. Bose and Raymond Courteau

It is certified that error appears in the above-identified patent and that said Letters Patent is hereby corrected as shown below:

Column 8, line 61, "conductor" should read --inductor--.

Signed and Sealed this

Third Day of September, 1991

*Attest:*

HARRY F. MANBECK, JR.

*Attesting Officer*     *Commissioner of Patents and Trademarks*